US010049709B2

(12) United States Patent
Yeung et al.

(10) Patent No.: US 10,049,709 B2
(45) Date of Patent: Aug. 14, 2018

(54) PORT MODES FOR USE WITH MEMORY

(71) Applicant: ARM Limited, Cambridge (GB)

(72) Inventors: Gus Yeung, Austin, TX (US);
Fakhruddin Ali Bohra, Austin, TX (US); George McNeil Lattimore, Austin, TX (US)

(73) Assignee: ARM Limited, Cambridge (GB)

( * ) Notice: Subject to any disclaimer, the term of this patent is extended or adjusted under 35 U.S.C. 154(b) by 0 days.

(21) Appl. No.: 14/986,215

(22) Filed: Dec. 31, 2015

(65) Prior Publication Data

US 2017/0194046 A1    Jul. 6, 2017

(51) Int. Cl.
| | |
|---|---|
| *G11C 8/16* | (2006.01) |
| *G11C 11/418* | (2006.01) |
| *G11C 11/419* | (2006.01) |
| *G11C 11/413* | (2006.01) |

(52) U.S. Cl.
CPC ............. *G11C 8/16* (2013.01); *G11C 11/413* (2013.01); *G11C 11/418* (2013.01); *G11C 11/419* (2013.01); *G11C 2207/2209* (2013.01)

(58) Field of Classification Search
CPC ........................................................ G11C 8/16
See application file for complete search history.

(56) References Cited

U.S. PATENT DOCUMENTS

| | | | | |
|---|---|---|---|---|
| 5,566,123 A * | 10/1996 | Freidin | ............... | G11C 7/1072 326/38 |
| 7,286,415 B2 * | 10/2007 | Kwon | ............... | G11C 7/1075 365/189.02 |
| 7,606,108 B2 * | 10/2009 | New | ............... | G11C 8/16 365/154 |
| 8,045,401 B2 | 10/2011 | Chong et al. | | |
| 8,582,389 B2 | 11/2013 | Gajjewar et al. | | |
| 2009/0244999 A1 | 10/2009 | Aitken | | |
| 2010/0329044 A1 | 12/2010 | Yeung | | |

(Continued)

OTHER PUBLICATIONS

Yang, et al.; A high-performance low VMIN 55nm 512Kb disturb-free 8T SRAM with adaptive VVSS control; IEEE International 2011 SOC Conference; pp. 197-200; Sep. 2011.

(Continued)

*Primary Examiner* — Harry W Byrne
*Assistant Examiner* — R Lance Reidlinger
(74) *Attorney, Agent, or Firm* — Pramudji Law Group PLLC; Ari Pramudji

(57) ABSTRACT

Various implementations described herein may refer to and may be directed to using port modes with memory. In one implementation, a memory device may include access control circuitry used to selectively activate one of a plurality of first word-lines based on first address signals from a first access port, and used to selectively activate one of a plurality of second word-lines based on assigned address signals. The access control circuitry may include address selection circuitry configured to select the assigned address signals based on a port mode signal, where the address selection circuitry selects the first address signals as the assigned address signals when the port mode signal indicates a single port mode, and where the address selection circuitry selects second address signals from a second access port as the assigned address signals when the port mode signal indicates a dual port mode.

18 Claims, 6 Drawing Sheets

(56) References Cited

U.S. PATENT DOCUMENTS

2011/0072323 A1  3/2011  Chong et al.
2012/0320694 A1  12/2012  Gajjewar et al.
2013/0114332 A1  5/2013  Laplanche et al.
2014/0025902 A1  1/2014  Dhogale

OTHER PUBLICATIONS

Suzuki, et al.; A Stable 2-Port SRAM Cell Design Against Simultaneously Read/Write-Disturbed Accesses; IEEE Journal of Solid-State Circuits ; vol. 43, No. 9; pp. 2109-2119; Sep. 2008.
Nii, et al.; A 45-nm single-port and dual-port SRAM family with robust read/write stabilizing circuitry under DVFS environment; 2008 IEEE Symposium on VLSI Circuits; pp. 212-213; Jun. 2008.
Takeda, et al.; A read-static-noise-margin-free SRAM cell for low-VDD and high-speed applications; IEEE Journal of Solid-State Circuits; vol. 41, No. 1, pp. 113-121; Jan. 2006.

\* cited by examiner

PORT MODES FOR USE WITH MEMORY

BACKGROUND

This section is intended to provide information relevant to understanding various technologies described herein. As the section's title implies, this is a discussion of related art that should in no way imply that it is prior art. Generally, related art may or may not be considered prior art. It should therefore be understood that any statement in this section should be read in this light, and not as any admission of prior art.

Integrated circuits (IC) may be formed from arrangements of one or more input/output devices, standard devices, memory devices, and/or the like. In one scenario, memory devices may include memory arrays arranged into memory cells and the associated circuitry to write data to the memory cells and read data from the memory cells. In particular, the memory cells of a memory array, such as a random access memory (RAM) array, may be organized into rows and columns. The logic latches within these individual memory cells may be used to store a data bit that is representative of a logical "1" or "0." These memory cells may also be interconnected by word-lines (WL) and pairs of complementary bit-lines (BL).

In some scenarios, memory devices with dual ports may be used. The memory arrays of these devices may have two pairs of complementary bit-lines and two word-lines for each memory cell, with each port controlling a respective word-line and pair of complementary bit-lines. In these scenarios, the dual port memory array may allow two memory cells to be accessed in the same memory clock cycle by the use of these different ports, word-lines, and bit-lines.

In a further scenario, the memory array may be vulnerable to errors. For example, write failures and/or read failures may occur in the memory array in certain conditions, such as when the memory array may be operating at lower voltages, higher speeds, and/or smaller topologies. To avoid such failures, one or more write assist or read assist mechanisms may be used with the memory array.

BRIEF DESCRIPTION OF THE DRAWINGS

Implementations of various techniques will hereafter be described herein with reference to the accompanying drawings. It should be understood, however that the accompanying drawings illustrate only various implementations described herein and are not meant to limit the scope of various technologies described herein.

DETAILED DESCRIPTION

Figure 1:
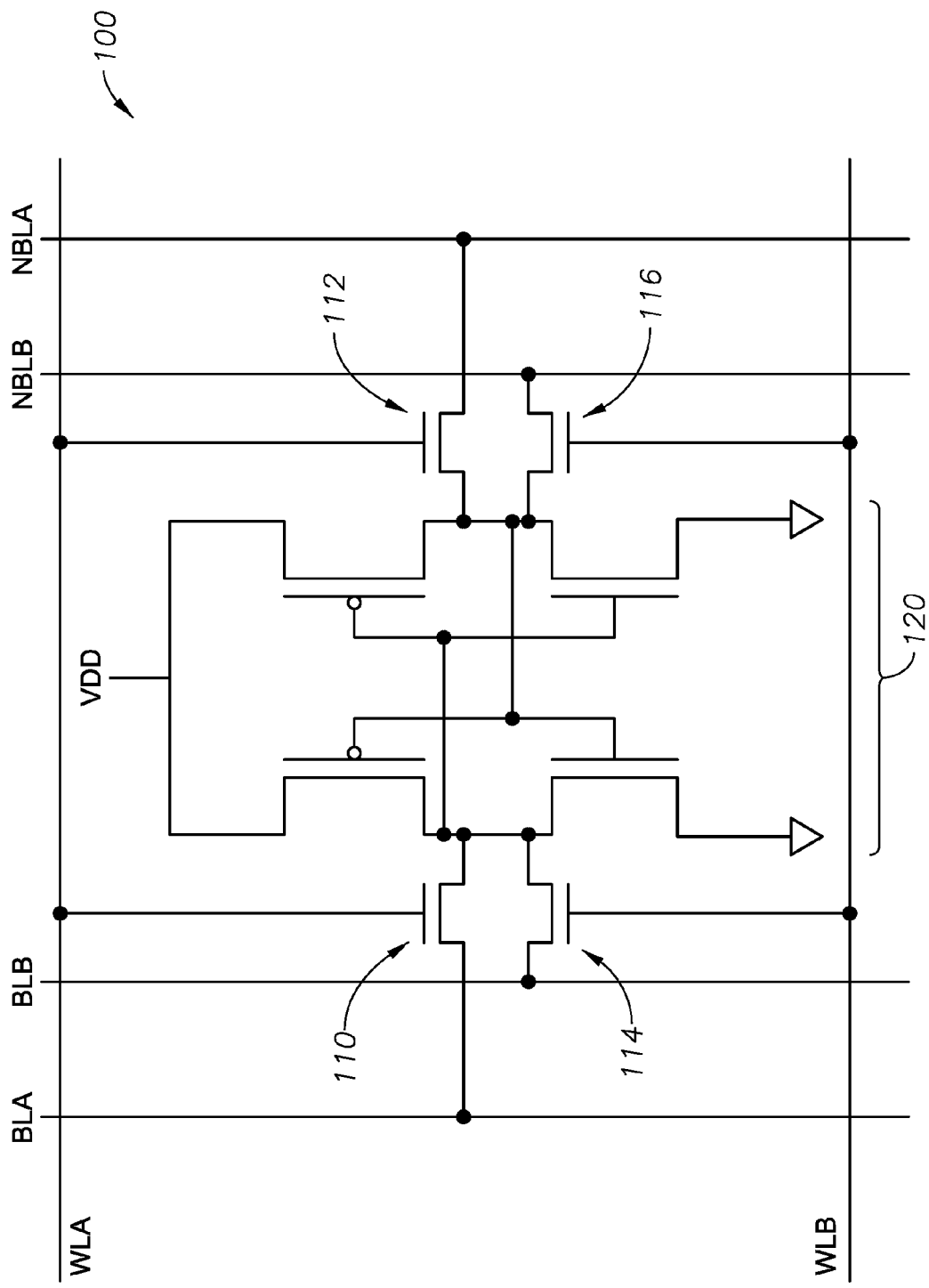
FIG. 1 illustrates a block diagram of a static random-access memory (SRAM) cell in accordance with various implementations described herein.

Various implementations described herein may refer to and may be directed to using port modes with memory. For instance, in one implementation, a memory device may include a memory array having a plurality of memory cells, where the memory cells are configured to be accessed using a plurality of first word-lines and a plurality of second word-lines. The memory device may include a plurality of access ports, such as a first access port and a second access port, where the first access port is configured to receive first address signals and the second access port is configured to receive second address signals. The memory device may include access control circuitry used to selectively activate one of the plurality of first word-lines based on the first address signals, and used to selectively activate one of the plurality of second word-lines based on assigned address signals. The access control circuitry may include address selection circuitry configured to select the assigned address signals based on a port mode signal, where the address selection circuitry selects the first address signals as the assigned address signals when the port mode signal indicates a single port mode, and where the address selection circuitry selects the second address signals as the assigned address signals when the port mode signal indicates a dual port mode Various implementations of using port modes with memory will now be described in more detail with reference to FIGS. 1-7.

As noted above, integrated circuits (IC) may be formed from arrangements of one or more input/output devices, standard devices, memory devices, and/or other devices. Input/output devices may be used to provide signals between the connection pins of the IC and the standard devices and memory devices arranged within the IC. Standard devices may be circuit implementations of flip-flops, arithmetic logic units, multiplexers, retention flops, balloon flops, latches, logic gates, and/or the like.

Memory devices may include memory arrays arranged into memory cells and the associated circuitry to write data to the memory cells and read data from the memory cells. In particular, the memory array may include a plurality of individual memory cells, where the memory array may be organized in rows and columns. The array may have N rows and M columns, and, therefore, may have N×M individual memory cells. Each memory cell may be used to store a data bit that is representative of a logical "1" or "0".

Further, the memory devices may include a multiport memory array, such as a dual port memory array. A memory array of such a device may have two pairs of complementary bit-lines for each column of memory cells and two word-lines for each row of memory cells. In one implementation, each port may control a particular word-line for each row and a particular pair of complementary bit-lines for each column. Accordingly, as is known in the art, the dual port memory array may allow two memory cells to be accessed in the same memory clock cycle by the use of these different ports, word-lines, and bit-lines. The memory array may be a random-access memory (RAM) array, such as a static RAM (SRAM) array, a dynamic RAM (DRAM) array, a correlated electron RAM (ceRAM) array, a ferroelectric RAM (fe-RAM) array, and/or any other implementation known to those skilled in the art.

For example, the memory array may be a dual port SRAM array composed of dual port SRAM cells, such as an SRAM cell 100 of FIG. 1, which illustrates a block diagram of the SRAM cell 100 in accordance with various implementations described herein. As illustrated, the SRAM cell 100 may be an eight transistor memory cell. However, the dual port SRAM array may be composed of dual port SRAM cells with any transistor configuration known to those skilled in the art.

Each SRAM cell 100 may include a feedback loop 120, where the feedback loop 120 may be used to hold a data value in each SRAM cell 100. The SRAM cell 100 may include two pass gate transistors 110, 112 controlled by a first word-line WLA and two pass gate transistors 114, 116 controlled by a second word-line WLB. The first word-line WLA may activate the pass gate transistors 110, 112 to connect the SRAM cell 100 to a first pair of complementary bit-lines BLA, NBLA. Similarly, the second word-line WLB may activate the pass gate transistors 114, 116 to connect the SRAM cell 100 to a second pair of complementary bit-lines BLB, NBLB.

Accordingly, the dual port SRAM array may include a first word-line WLA and a second word-line WLB for each row of the array, and may include a first pair of bit-lines BLA, NBLA and a second pair of bit-lines BLB, NBLB for each column of the array. Thus, for example, in a dual port SRAM array with N rows and M columns of the SRAM cells 100, the array may include N first word-lines WLA and N second word-lines WLB, along with M first pairs of bit lines and M second pairs of bit-lines.

In operation, and as known to those skilled in the art, the dual port SRAM array may be configured to allow two SRAM cells 100 of the array to be accessed in the same memory clock cycle through the different ports, word-lines, and bit-lines. When allowing two memory cells to be accessed in such a manner, a memory array may be said to be operating in a dual port mode.

For memory arrays operating in a dual port mode, each port of a memory device may control a particular word-line for each row and a particular pair of complementary bit-lines for each column of the array. For example, for a dual port SRAM array of SRAM cells 100 operating in dual port mode, a first port (hereinafter "port A") of the memory device may control the first pair of complementary bit-lines BLA, NBLA for each column and the first word-line WLA for each row. Similarly, a second port (hereinafter "port B") of the memory device may control the second pair of complementary bit-lines BLB, NBLB for each column and the second word-line WLB for each row.

When the dual port SRAM array is operating in a dual port mode, an address received at port A may indicate that a first SRAM cell 100 is to be accessed. To access the first SRAM cell 100, the first pair of complementary bit-lines BLA, NBLA corresponding to the first SRAM cell 100 may be precharged. Following the precharge, the first word-line WLA corresponding to the first SRAM cell 100 may be activated in order to connect the feedback loop 120 of the first SRAM cell 100 to the first pair of complementary bit-lines BLA, NBLA. During a read operation, a value stored in the feedback loop 120 of the first SRAM cell 100 may be transferred to the connected bit-line pair. During a write operation, a value to be written to the first SRAM cell 100 may be transferred to the connected bit-line pair, and the value may then be transferred from the connected bit-line pair to the feedback loop 120 of the first SRAM cell 100.

During the same memory clock cycle, an address received at port B may indicate that a second SRAM cell 100 of the array is to be accessed. To access the second SRAM cell 100, the second pair of complementary bit-lines BLB, NBLB corresponding to the second SRAM cell 100 may be precharged. Following the precharge, the second word-line WLB corresponding to the second SRAM cell 100 may be activated in order to connect the feedback loop 120 of the second SRAM cell 100 to the second pair of complementary bit-lines BLB, NBLB. During a read operation, a value stored in the feedback loop 120 of the second SRAM cell 100 may be transferred to the connected bit-line pair. During a write operation, a value to be written to the second SRAM cell 100 may be transferred to the connected bit-line pair, and the value may then be transferred from the connected bit-line pair to the feedback loop 120 of the second SRAM cell 100.

In a further implementation, when operating in the dual port mode, a memory array may employ read assist mechanisms when performing read operations for one or more memory cells of the array in a single memory clock cycle.

For example, for a dual port SRAM array of SRAM cells 100 operating in a dual port mode, read operations to a first SRAM cell 100 and a second SRAM cell 100 may be performed, where the first SRAM cell 100 and the second SRAM cell 100 are positioned on the same row in the SRAM array. The pairs of complementary bit-lines corresponding to both cells 100 may be initially precharged. In such an example, a first word-line WLA associated with both SRAM cells 100 may be activated, allowing a value stored in the first SRAM cell 100 to be transferred to a corresponding bit-line pair. Further, a read assist mechanism may be employed where, only after a time delay has passed from when the first word-line WLA was activated, a second word-line WLB associated with both SRAM cells 100 may be activated, allowing a value stored in the second SRAM cell 100 to be transferred to a corresponding bit-line pair.

In such an example, without employing the read assist mechanism of a time delay between activations of WLA and WLB, corruption of stored values may occur in memory cells that are positioned in the same row as the first SRAM cell 100 and the second SRAM cell 100. Because both the first word-line WLA and the second word-line BLB are activated during the above-described write assist operation, other cells 100 along the same row will become connected to their bit-lines, which may lead to a charge being injected into these cells. If the charge is sufficiently high, then a cell 100 not being written to may have its storage value disturbed. To minimize the occurrence of such disturbances, in some implementations, a memory device may introduce a time delay before activating the second word-line WLB.

Such a read assist mechanism may be used for memory devices operating in environments where the corruption of stored values may be likely. In particular, such environments may include those that are characterized by lower voltages, higher speeds, and/or smaller topologies In some implementations, a dual port memory array may be configured to operate in a single port mode. In a single port mode, in order to access a single memory cell, the dual port memory array may use both pairs of complementary bit-lines and both word-lines associated with the memory cell. For example, the dual port memory array may employ write assist mechanisms to use both pairs of complementary bit-lines and both word-lines for a memory cell in order to write one value to the cell. Such write assist mechanisms may be used to increase the probability of a successful write operation to the cell (i.e., to increase the writeability of the cell). Write assist mechanisms may be used for memory devices operating in environments where the occurrence of write failures may be likely. In particular, such environments may include those that are characterized by lower voltages, higher speeds, and/or smaller topologies. Implementations of write assist operations are described in further detail in commonly-assigned U.S. Pat. No. 8,582,389, the entire disclosure of which is herein incorporated by reference.

For example, for a dual port SRAM array of SRAM cells 100 operating in a single port mode, a write assist operation to a first SRAM cell 100 may initially include precharging both the first pair of complementary bit-lines BLA, NBLA and the second pair of complementary bit-lines BLB, NBLB that correspond to the first SRAM cell 100. Both the first word-line WLA and the second word-line BLB may then be activated, as well. Accordingly, during the write assist operation, a value to be written to the first SRAM cell 100 may be transferred to both the first pair of complementary bit-lines BLA, NBLA and the second pair of complementary bit-lines BLB, NBLB, and the value may then be transferred from both pairs of complementary bit-lines to the feedback loop 120 of the first SRAM cell 100.

In some instances of performing a write assist as described above, corruption of stored values may occur in memory cells 100 that are positioned in the same row as the first SRAM cell 100. Because both the first word-line WLA and the second word-line BLB are activated during the above-described write assist operation, other cells 100 along the same row will become connected to their bit-lines, which may lead to a charge being injected into these cells. If the charge is sufficiently high, then a cell 100 not being written to may have its storage value disturbed. To minimize the occurrence of such disturbances, in some implementations, a memory device may introduce a time delay before activating a second word-line WLB for a cell 100 during a write assist operation, as also discussed in further detail in commonly-assigned U.S. Pat. No. 8,582,389. As a result, for other cells 100 that are connected to the same word-lines of the cell 100 being written to, the charges associated with the second pairs of complementary bit-lines BLB, NBLB of these cells may experience decay. Accordingly, by providing a time delay in activating a second word-line, these other cells 100 may avoid an injection of a charge that would be sufficiently high to disturb stored values. Similarly, in other implementations used to avoid disturbing stored values, a memory device may activate the second word-line WLB, and then introduce a time delay before activating the first word-line WLA when performing a write assist operation.

In another example, a read assist mechanism may be employed where two read operations may not be performed for a row of cells 100 in a memory array in a single memory clock cycle. For example, for a dual port SRAM array of SRAM cells 100 operating in a single port mode, read operations to a first SRAM cell 100 may be performed. The pairs of complementary bit-lines corresponding to the first SRAM cell 100 may be initially precharged. In such an example, a first word-line WLA or a second word-line WLB associated with the first SRAM cell 100 may be activated, but not both, allowing a value stored in the first SRAM cell 100 to be transferred to a corresponding bit-line pair. By performing only one read operation from the row containing the first SRAM cell 100, only one word-line may be activated. As such, corruption of stored values in memory cells in the same row as the first SRAM cell may be minimized.

Thus, a memory array operating in a single port mode may access a single memory cell via both pairs of complementary bit-lines and both word-lines associated with the memory cell, such as when performing a write assist on the memory cell. This memory array could, for example, be used in low voltage applications where the risk of a write failure may be higher. On the other hand, a memory array operating in a dual port mode may allow two memory cells of the array to be accessed in the same memory clock cycle through different ports, word-lines, and bit-lines. Such a memory array could be used, for example, in applications involving two processors that would access the memory array simultaneously.

In view of the above, various implementations described herein may be used to select a port mode for a dual port memory array of a memory device. In particular, a port mode signal may be used to toggle (i.e. switch) the dual port memory array between a single port mode and a dual port mode.

Figure 2:
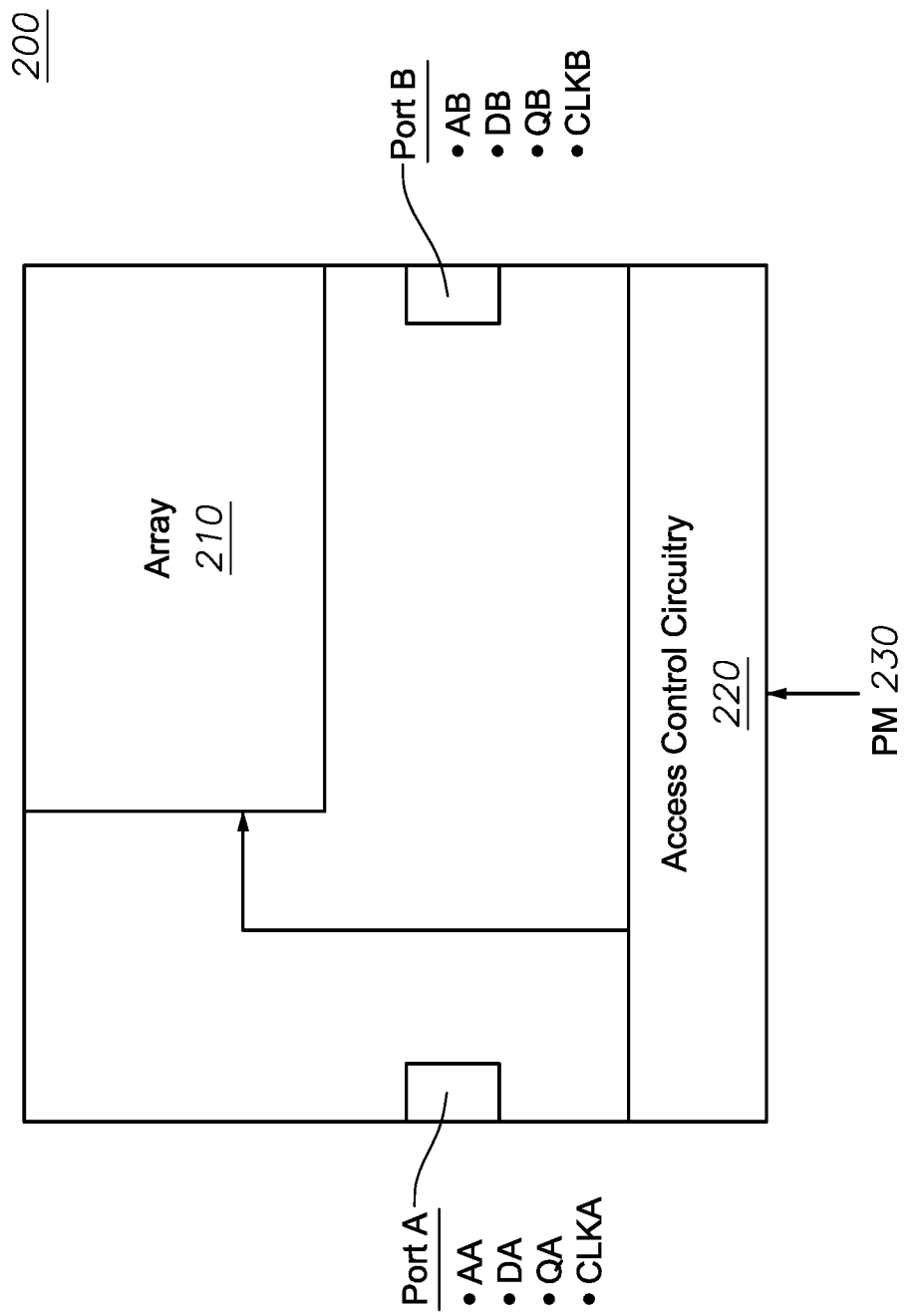
FIGS. 2-3 illustrate a block diagram of a memory device in accordance with various implementations described herein.

In one implementation, a memory device may include a memory array and access control circuitry, where the access control circuitry may be used to toggle the memory array between a single port mode and a dual port mode based on the port mode signal. FIG. 2 illustrates a block diagram of a memory device 200 in accordance with various implementations described herein. As shown, the memory device 200 may include a dual port memory array 210 and access control circuitry 220. Though the discussion below is with respect to a dual port memory array, those skilled in the art would understand to apply the implementations below to a multiport memory array of any configuration.

The dual port memory array 210 may be similar to the memory arrays described above. The dual port memory array 210 may be a RAM array, such as an SRAM array, a DRAM array, a ceRAM array, a feRAM array, and/or any other implementation known to those skilled in the art. In a further implementation, the dual port memory array 210 may be composed of dual port SRAM cells 100 described above with respect to FIG. 1. As noted above, these dual port SRAM cells 100 may be built using an eight transistor configuration or any other transistor configuration known to those skilled in the art.

As shown in FIG. 2, the memory device 200 may include two ports, port A and port B, through which other devices or the like may communicate with the memory device 200. For instance, two processors may communicate with the memory device 200 via port A and port B. In a further implementation, and as known to those skilled in the art, port A and port B may each be configured to receive respective memory array address signals and data input signals, and to transfer respective data output signals. Each port may also be configured to receive respective clock signals. The address signals received via port A may hereinafter be referred to as address signals AA, and the address signals received via port B may hereinafter be referred to as address signals AB. The address signals AA and AB may each indicate a location of a memory cell that is to be accessed in the array 210.

The data input signals received via port A may hereinafter be referred to as data input signals DA, and the data input signals received via port B may hereinafter be referred to as data input signals DB. The data output signals transferred via port A may hereinafter be referred to as data output signals QA, and the data output signals transferred via port B may hereinafter be referred to as data output signals QB. Similarly, the clock signals received via port A may hereinafter be referred to as clock signals CLKA, and the clock signals received via port B may hereinafter be referred to as clock signals CLKB. As further described below, the clock signals CLKA and CLKB may be used to control the timing of the accesses to the memory cells of the array 210.

As further described below, the access control circuitry 220 may be used to control the access to the memory cells of the array 210. In particular, the access control circuitry 220 may be used to toggle the memory array 210 between a single port mode and a dual port mode based on a port mode (PM) signal 230. In one implementation, and as further described below, the access control circuitry 220 may include address decoder circuitry and timing circuitry for use in accessing the memory cells.

The access control circuitry 220 may directly receive the PM signal 230. As shown, the PM signal 230 may be received by the memory device 200, such as via an input pin in a pin configuration of the memory device 200. In another implementation, the PM signal 230 may be derived by the memory device 200 based on other signals, such as an internal memory clock, memory enable signals, write enable signals, and/or any other signals known to those skilled in the art. The derived PM signal 230 may then be transferred to the access control circuitry 220.

Figure 3:
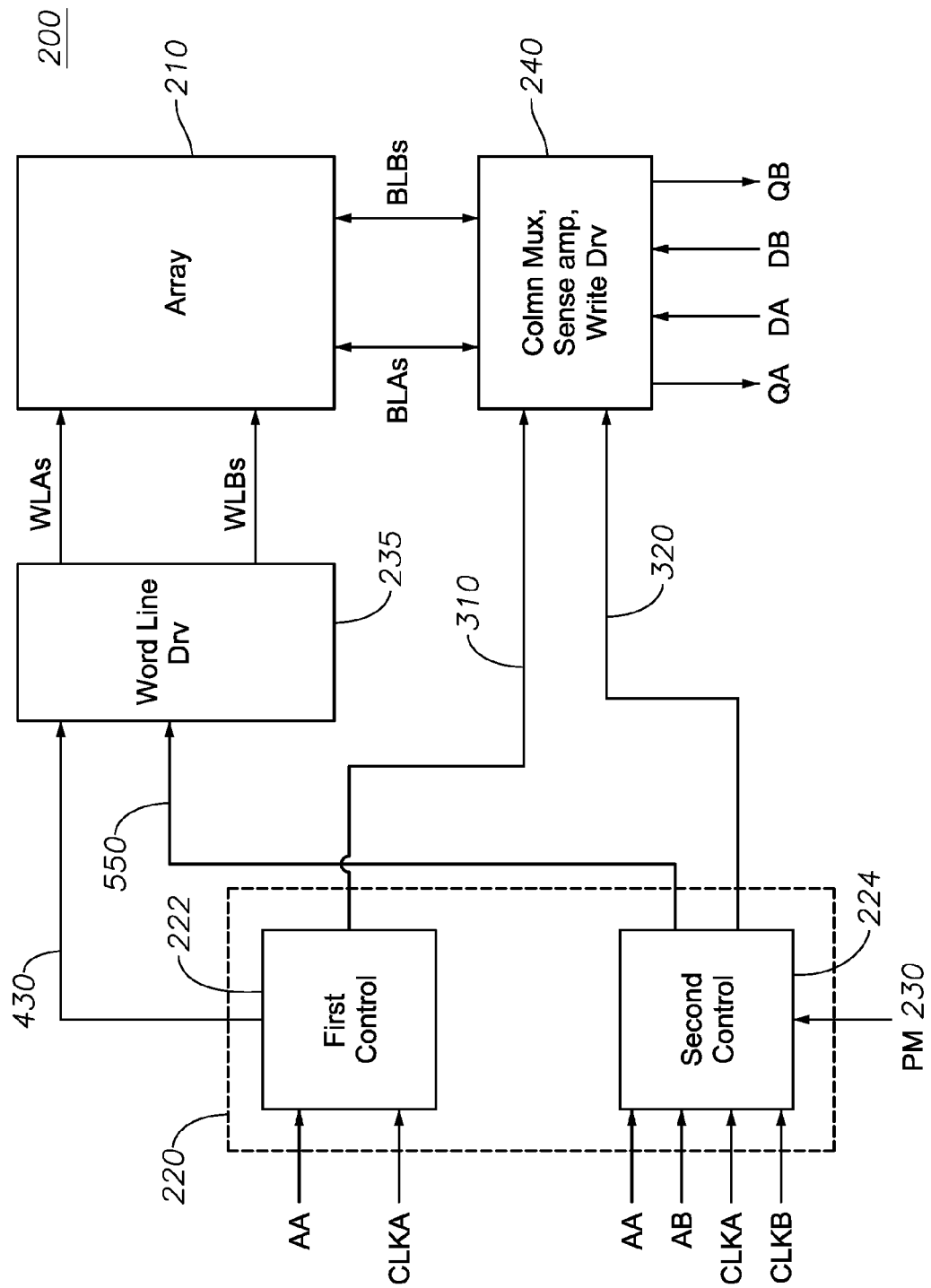

FIG. 3 illustrates a more detailed block diagram of the memory device 200 in accordance with various implementations described herein. As shown, in addition to the dual port memory array 210 and the access control circuitry 220, the memory device 200 may include word-line drivers 235 and input/output circuitry 240.

The word-line drivers 235 may be used to drive the word-lines of the memory array 210. As shown, the dual port memory array 210 may be composed of dual port SRAM cells 100, so the word-line drivers 235 may be used to drive the first word-lines WLA and the second word-lines WLB of the array 210. The input/output circuitry 240 may include column multiplexers, sense amplifiers, and write drivers, as is known to those skilled in the art. In particular, the column multiplexers may be used to multiplex a pair of complementary bit-lines (e.g., BLA and NBLA, or BLB and NBLB) in a column into a single sense amplifier. The sense amplifier may be used to amplify differential voltage signals between the complementary bit-lines during a read operation. These small differential voltage signals may be representative of the data value stored in a particular individual SRAM cell 100, and may be amplified by the sense amplifier to a recognizable logic level to allow the data value to be properly interpreted by logic outside of the memory array 210. In addition, as is known to those skilled in the art, the write drivers may be used in conjunction with the column multiplexers to drive a data value onto the bit-lines in response to a write request.

As shown, the access control circuitry 220 may also include first control circuitry 222 and second control circuitry 224. The first control circuitry 222 may be used, in conjunction with the word-line drivers 235, to selectively activate one of the first word-lines WLA of the array 210 based on the address signals AA. The first control circuitry 222 may also be used, in conjunction with the word-line drivers 235, to selectively activate one of the first word-lines WLA based on the clock signals CLKA.

Figure 4:
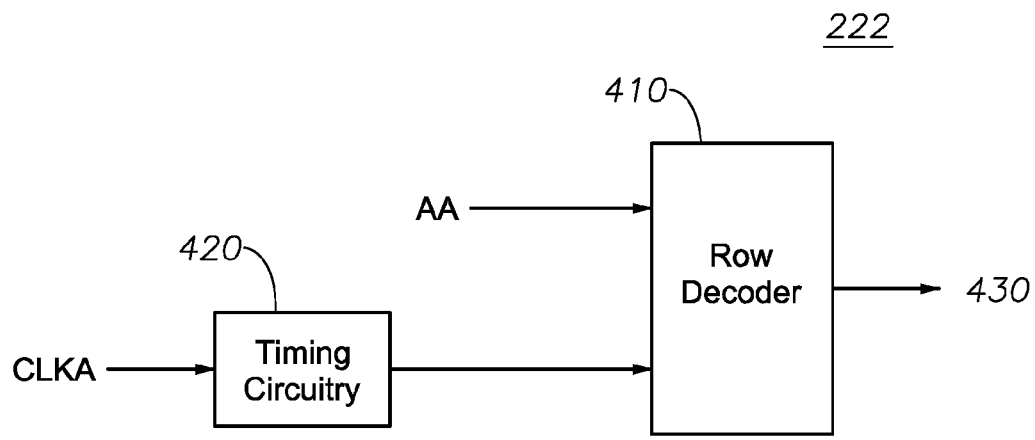
FIG. 4 illustrates a block diagram of a first control circuitry in accordance with various implementations described herein.

FIG. 4 illustrates a more detailed block diagram of the first control circuitry 222 in accordance with various implementations described herein. As shown, the first control circuitry 222 may include a row decoder 410 and timing circuitry 420. The row decoder 410 may be configured to receive and decode the address signals AA, where the address signals may be encoded when received via port A. An output 430 of the row decoder 410 may include the decoded address signals AA, and the output 430 may be used by the word-line drivers 235 to activate one of the first word-lines WLA of the array 210.

The timing circuitry 420 may be responsive to clock signals CLKA, where the timing circuitry 420 may use the clock signals CLKA to generate a pulse, which, in turn, may be used to control the activation of the row decoder 410. Accordingly, the timing circuitry 420 may use the clock signals CLKA to control the timing of the selective activation of the first word-lines WLA.

In a further implementation, the first control circuitry 222 may include a column decoder (not shown), which may also be configured to receive and decode the address signals AA. An output 310 of the column decoder may be used by the input/output circuitry 240 to selectively activate one of the first pairs of complementary bit-lines BLA, NBLA of the array 210, as is known to those skilled in the art. Further, the first control circuitry 222 may also include column timing circuitry (not shown) to control the activation of the column decoder based on the clock signals CLKA.

Returning to FIG. 3, the second control circuitry 224 may be used, in conjunction with the word-line drivers 235, to selectively activate one of the second word-lines WLB of the array 210. In particular, and as further described below, based on the PM signal 230, the second control circuitry 224 may select address signals (hereinafter referred to as the "assigned address signals") from either the address signals AA or the address signals AB. In turn, the second control circuitry 224 may then be used in conjunction with the word-line drivers 235 to selectively activate one of the second word-lines WLB of the array 210 based on the assigned address signals. In a further implementation, as described below, based on the PM signal 230, the second control circuitry 224 may select clock signals (hereinafter referred to as the "assigned clock signals") from either the clock signals CLKA or the clock signals CLKB. The second control circuitry 224 may then be used in conjunction with the word-line drivers 235 to selectively activate one of the second word-lines WLB of the array 210 based on the assigned clock signals.

Figure 5:
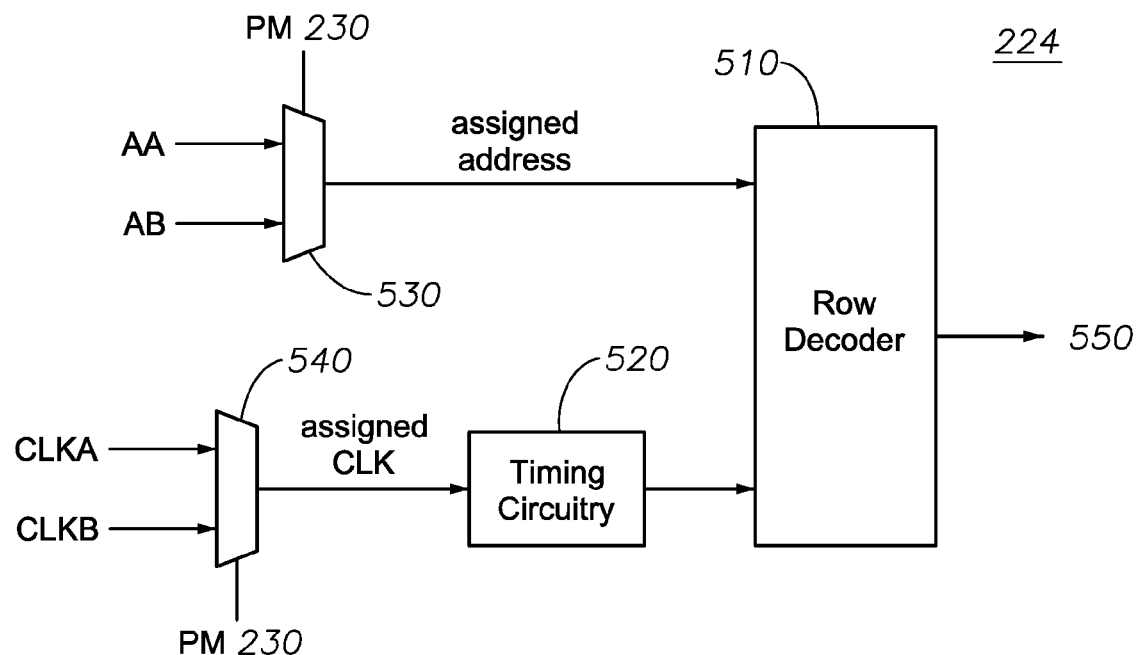
FIG. 5 illustrates a block diagram of the second control circuitry in accordance with various implementations described herein.

FIG. 5 illustrates a more detailed block diagram of the second control circuitry 224 in accordance with various implementations described herein. As shown, the second control circuitry 224 may include a row decoder 510 and timing circuitry 520. The second control circuitry 224 may also include address selection circuitry 530 and clock selection circuitry 540.

The address selection circuitry 530 may be used to select the assigned address signals based on the PM signal 230. As shown, the address selection circuitry 530 may be a 2-to-1 mulitiplexer. Other implementations known to those skilled in the art may also be used for the address selection circuitry 530. Accordingly, as shown, if the PM signal is a logic "0" value, then the address selection circuitry 530 may select the address signals AA as the assigned address signals. Conversely, if the PM signal is a logic "1" value, then the address selection circuitry 530 may select the address signals AB as the assigned address signals.

The row decoder 510 may be configured to then receive and decode the assigned address signals. An output 550 of the row decoder 510 may include the decoded assigned address signals, and the output 550 may be used by the word-line drivers 235 to activate one of the second word-lines WLB of the array 210.

Accordingly, to toggle the memory array 210 into a single port mode, the PM signal may be set to a value that would cause the address selection circuitry 530 to select the address signals AA as the assigned address signals (e.g., a logic "0" value in FIG. 5), because, in such a scenario, the word-line drivers 235 would selectively activate the first word-lines WLA and the second word-lines WLB based on the same address (i.e., address signals AA), as both outputs 430 and 550 used by the word-line drivers would include the decoded address signals AA. Thus, a first word-line WLA and a second word-line WLB would be activated for the same row of memory cells 100 in the array 210, thereby allowing the array 210 to operate in a single port mode (e.g., perform write assist operations for a single memory cell 100, as described above).

Similarly, to toggle the memory array 210 into a dual port mode, the PM signal may be set to a value that would cause the address selection circuitry 530 to select the address signals AB as the assigned address signals (e.g., a logic "1" value in FIG. 5), because, in such a scenario, the word-line drivers 235 would selectively activate one of the first word-lines WLA based on the decoded address signals AA from row decoder 410, and selectively activate one of the second word-lines WLB based on the decoded address signals AB from row decoder 510. Thus, a first word-line WLA and a second word-line WLB could be activated for different rows of memory cells 100 in the array 210, thereby allowing the array 210 to operate in a dual port mode (i.e., allow two memory cells 100 of the array to be accessed simultaneously).

In a further implementation, the clock selection circuitry 540 may be used to select the assigned clock signals based on the PM signal 230. As shown, the clock selection circuitry 540 may be a 2-to-1 mulitiplexer. Other implementations known to those skilled in the art may also be used for the clock selection circuitry 540. Accordingly, if the PM signal is a logic "0" value, then the clock selection circuitry 530 may select the clock signals CLKA as the assigned clock signals. Conversely, if the PM signal is a logic "1" value, then the clock selection circuitry 530 may select the clock signals CLKB as the assigned clock signals.

The timing circuitry 520 may be configured to then receive the assigned clock signals, where the timing circuitry 520 may use the assigned clock signals to generate a pulse, which, in turn, may be used to control the activation of the row decoder 510. Thus, the timing circuitry 520 may use the assigned clock signals to control the timing of the selective activation of the second word-lines WLB.

Accordingly, when the memory array 210 is toggled into a single port mode (i.e. the clock signals CLKA are the assigned clock signals), the selective activations of the first word-lines WLA and the second word-lines WLB are both based on the clock signals CLKA. Thus, a first word-line WLA and a second word-line WLB would be activated for the same row of memory cells 100 in the array 210 at the same time, thereby allowing the array 210 to operate in a single port mode (e.g., perform write assist operations or read assist operations). In a further implementation, when performing a write assist operation for a single memory cell 100, the timing circuitry 520 may introduce a time delay when activating the row decoder 510, which would then delay the selective activation of one of the second word-lines WLB, thereby minimizing the risk of disturbing stored values in other cells of the row. In another implementation, when performing a write assist operation for a single memory cell 100, the timing circuitry 420 may introduce a time delay when activating the row decoder 410, which would then delay the selective activation of one of the first word-lines WLA, thereby minimizing the risk of disturbing stored values in other cells of the row.

Similarly, when the memory array 210 is toggled into a dual port mode (i.e. the PM signal 230 is set to a logic "1" value), the selective activation of one of the first word-lines WLA may be based on clock signals CLKA from timing circuitry 420, and the selective activation of one of the second word-lines WLB may be based on clock signals CLKB from timing circuitry 520. Thus, a first word-line WLA and a second word-line WLB could be activated for different rows of memory cells 100 in the array 210 using different clocks, thereby allowing the array 210 to operate in a dual port mode (i.e., allow two memory cells 100 of the array to be accessed simultaneously).

In a further implementation, the second control circuitry 224 may include a column decoder (not shown), which may be configured to receive and decode the assigned address signals. An output 320 of the column decoder may be used by the input/output circuitry 240 to selectively activate one of the second pairs of complementary bit-lines BLB, NBLB of the array 210, as is known to those skilled in the art. Accordingly, when the memory array 210 is toggled into a single port mode (e.g., the PM signal 230 is set to a logic "0" value), the input/output circuitry 240 may selectively activate the first pairs of bit-lines and the second pairs of bit-lines based on the same address (e.g., address signals AA). Thus, a first pair of bit-lines and a second pair of bit-lines would be activated for the same column of memory cells 100 in the array 210, thereby allowing the array 210 to operate in a single port mode (e.g., perform write assist operations for a single memory cell 100, as described above). Similarly, when the memory array 210 is toggled into a dual port mode (e.g., the PM signal 230 is set to a logic "1" value), the input/output circuitry 240 may activate the first pairs of bit-lines and the second pairs of bit-lines based on different address signals. Thus, a first pair of bit-lines and a second pair of bit-lines could be activated for different columns of memory cells 100 in the array 210, thereby allowing the array 210 to operate in a dual port mode (i.e., allow two memory cells 100 of the array to be accessed simultaneously).

In another implementation, the first control circuitry 222 may include similar components as that of second control circuitry 224, including address selection circuitry and clock selection circuitry. Though not illustrated in FIGS. 2-5, a person skilled in the art would understand that the first control circuitry 222 may use a first PM signal and the second control circuitry 224 may use a second PM signal to activate word-lines of the memory array 210. For example, in such an implementation, the first control circuitry 222 may select address signals (hereinafter referred to as the "first assigned address signals") from either the address signals AA or the address signals AB based on the first PM signal. In turn, the first control circuitry 222 may then be used in conjunction with the word-line drivers 235 to selectively activate one of the first word-lines WLA of the array 210 based on the first assigned address signals. In a further implementation, based on the first PM signal, the first control circuitry 222 may select clock signals (hereinafter referred to as the "assigned clock signals") from either the clock signals CLKA or the clock signals CLKB. The first control circuitry 222 may then be used in conjunction with the word-line drivers 235 to selectively activate one of the first word-lines WLA of the array 210 based on the first assigned clock signals. The second control circuitry 224 may similarly select second assigned address signals from either the address signals AA or the address signals AB based on the second PM signal.

Returning to FIGS. 2-5, accordingly, the PM signal 230 may be used by the access control circuitry 220 (and the second control circuitry 224, in particular) to toggle the memory array 210 between a single port mode and a dual port mode. For example, FIG. 6 illustrates a timing diagram of the memory device 200 in accordance with various implementations described herein.

As shown, when the PM signal 230 may be set low (i.e., a logic "0" value), the memory array 210 may be toggled into a single port mode. Specifically, when in single port mode, the word-line drivers 235 may selectively activate the first word-lines WLA and the second word-lines WLB based on the same address (i.e., address signals AA), as both outputs 430 and 550 used by the word-line drivers would include the decoded address signals AA. As such, when in single port mode, a first word-line WLA and a second word-line WLB would be activated for the same row of memory cells 100 in the array 210 at the same time.

With the memory array 210 in the single port mode, a write assist operation may be performed for a particular memory cell 100, as was described above. Specifically, and as noted above, during the write assist operation, a value to be written to the memory cell 100 may be transferred to both a first pair of complementary bit-lines BLA, NBLA and a second pair of complementary bit-lines BLB, NBLB associated with the memory cell 100. Given that the first word-line WLA and the second word-line WLB of the memory cell 100 are activated, the same value may then be transferred from both pairs of complementary bit-lines to the memory cell 100.

Figure 6:
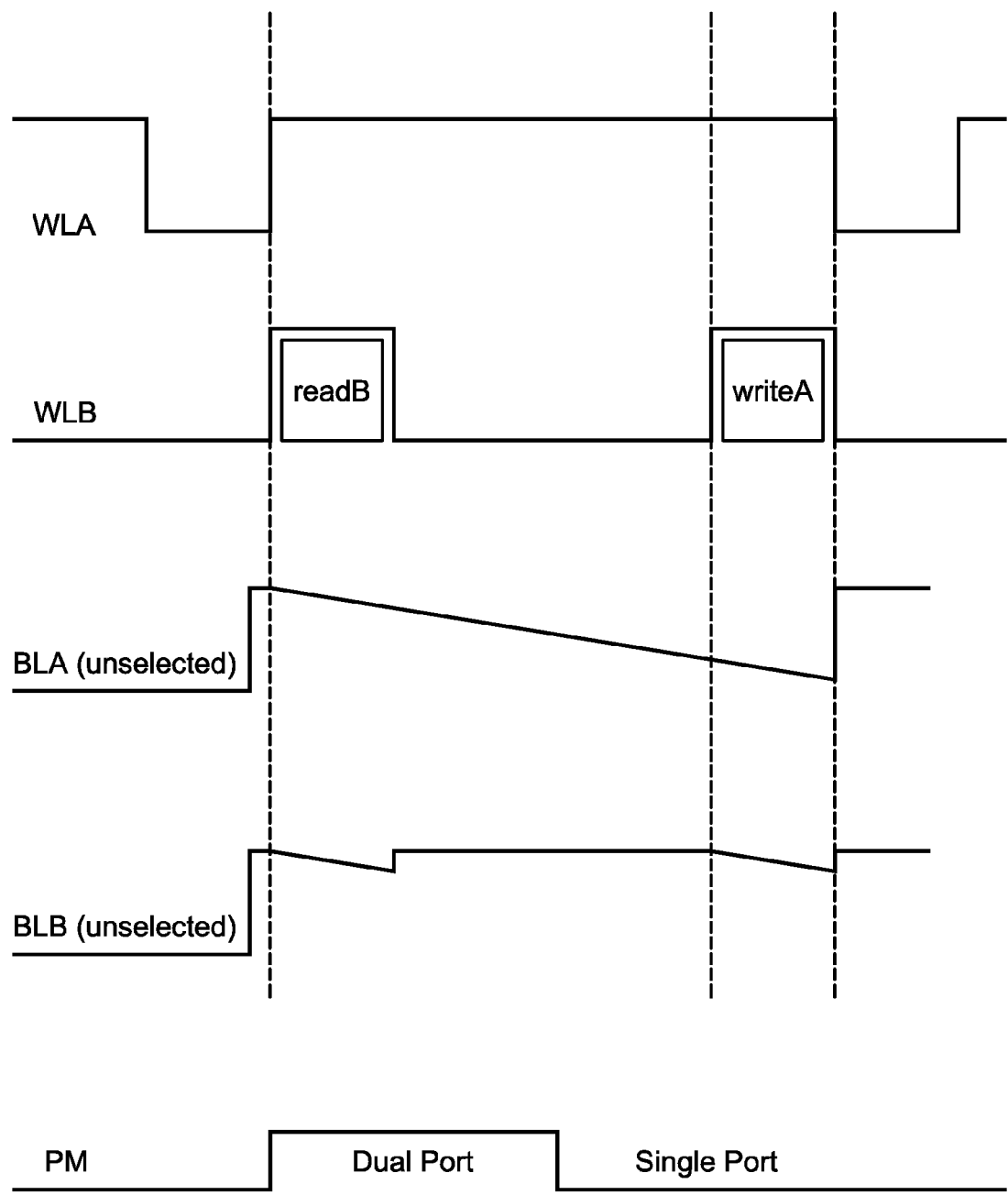
FIG. 6 illustrates a timing diagram of a memory device in accordance with various implementations described herein.

For example, as shown in FIG. 6, to perform the write assist operation with the memory array 210 in the single port mode, the first word-line WLA associated with a first memory cell 100 may initially be activated to perform a write operation for the memory cell 100 based on the decoded address signals AA. After a time delay from the activation of the first word-line WLA, the second word-line WLB associated with the first memory cell 100 may also be activated to perform a write operation for the first memory cell 100 based on the decoded address signals AA, as shown by the "writeA" pulse of WLB.

As was previously explained, the time delay allows for the decay of charges on the complementary bit-line pairs associated with other memory cells 100 on the same row as the first memory cell 100. For example, as shown in FIG. 6, the unselected bit-line BLA and the unselected bit-line BLB correspond to a second memory cell 100 on the same row as the first memory cell 100. During the time delay between the activation of the first word-line WLA in order to perform a write operation and the activation of the second word-line WLB in order to perform a write assist operation (i.e., the "writeA" operation), the charges associated with the unselected bit-line BLA and the unselected bit-line BLB may decrease. Accordingly, by the time of the activation of the second word-line WLB for the "writeA" operation, the charges on the unselected bit-line BLA and the unselected bit-line BLB may have decayed to the extent that the second memory cell 100 avoids an injection of a charge that would disturb a stored value in the second memory cell 100.

In another implementation, the PM signal 230 may be used by the access control circuitry 220 to toggle the memory array 210 between a single port mode and a dual port mode during a single memory clock cycle. In such an implementation, the memory array 210 may be accessed multiple times during the single memory clock cycle. As such, a memory device 200 operating in a low voltage environment may be configured to have a memory array 210 that operates in both dual port mode and single port mode during a single memory clock cycle.

For example, as noted above, FIG. 6 illustrates a first word-line WLA associated with a first memory cell 100 that may be activated during a single memory clock cycle in order to perform a write operation based on decoded address signals AA. In one implementation, the first word-line WLA may be activated once per memory clock cycle. As was also explained above, with the memory array 210 in a single port mode, the second word-line WLB may also be activated during the single memory clock cycle in order to perform a write assist operation for the first memory cell 100 based on the decoded address signals AA, as shown by the "writeA" pulse of WLB.

During the same single memory clock cycle, but before the activation of the second word-line WLB for the write assist operation, the memory array 210 may operate in a dual port mode, such as at the beginning of the memory clock cycle. With the PM signal 230 set high (i.e., a logic "1" value), the word-line drivers 235 may selectively activate the first word-lines WLA based on address signals AA, and selectively activate the second word-lines WLB based on address signals AB. Thus, a first word-line WLA and a second word-line WLB could be selectively activated to allow two different memory cells 100 of the array to be accessed simultaneously.

For example, as shown in FIG. 6, at the beginning of a single memory clock cycle, the PM signal 230 may be set high to place the memory array 210 in a dual port mode. In addition, at the beginning of the memory clock cycle, the first word-line WLA associated with a first memory cell 100 may be activated in order to perform a write operation to the first memory cell 100 based on decoded address signals AA. Further, at the beginning of the memory clock cycle, a second word-line WLB may be activated in order to perform a read operation from a second memory cell 100 based on decoded address signals AB, as shown by the "readB" pulse of WLB. The decoded address signals AA and AB may correspond to different rows of the memory array 210. Later during the memory clock cycle, the PM signal 230 may be set low to place the memory array 210 in a single port mode. During the single port mode, the write assist operation may be performed on the first memory cell 100. In such an example, the same first word-line WLA may remain activated as the memory array 210 is toggled from the dual port mode to the single port mode. Later during the memory clock cycle and during the single port mode, a second word-line WLB may be activated based on the decoded address signals AA in order to perform the write assist operation for the first memory cell 100 (i.e., the "writeA" operation), as described above. As such, both the first word-line WLA and the second-world line WLB may be activated based on the decoded address signals AA in order to perform the write assist operation for the first memory cell 100. Further, the period of time between the initial activation of the first word-line WLA during the dual mode operation of the array 210 and the activation of the second word-line WLB during the single mode operation of the array 210 may be greater than or equal to the time delay needed for the charges to sufficiently decay on the complementary bit-line pairs associated with other memory cells 100 on the same row as the first memory cell 100. As such, the write assist operation performed on the first memory cell 100 using the first word-line WLA and the second word-line WLB memory cell 100 may avoid injecting a charge that would disturb a stored value in one or more of the other cells 100 of the same row.

Toggling the memory array 210 between a single port mode and a dual port mode during a single memory clock cycle may allow for the activation of a particular set of word-lines multiple times during the memory clock cycle.

The accessing of a particular word-line set (i.e., WLAs or WLBs) twice during a single memory clock cycle may be referred to as double-pumping, as is the case for the example above.

Other examples that are similar to FIG. 6 may be performed, as well. In one such example, prior to performing the write assist operation for the first memory cell 100 during the memory clock cycle (i.e., the "writeA" operation during single port mode), a first word-line WLA associated with a first memory cell 100 may be activated in order to perform a write operation to the first memory cell 100 based on decoded address signals AA, and, with the memory array 210 operating in the dual port mode, a second word-line WLB may be activated in order to perform a read operation from a second memory cell 100 based on decoded address signals AB (i.e., the "readB" operation). However, in this example, the decoded address signals AA and AB may correspond to the same row of the memory array 210. Accordingly, to avoid disturbing the stored values of other cells 100 on the same row, the second word-line WLB may be activated for the readB operation only after a time delay has passed from when the first word-line WLA was activated for the writeA operation. Later during the memory clock cycle, the PM signal 230 may be set low to place the memory array 210 in a single port mode. During the single port mode, the write assist operation may be performed on the first memory cell 100. In such an example, the same first word-line WLA and the same second word-line WLB may remain activated as the memory array 210 is toggled from the dual port mode to the single port mode, as these word-lines already correspond to the row of the first memory cell 100. In particular, later during the memory clock cycle and during the single port mode, the first word-line WLA and the second word-line WLB may be used to perform the write assist operation for the first memory cell 100 based on the decoded address signals AA, as described above.

In another example, prior to performing the write assist operation for the first memory cell 100 during the memory clock cycle (i.e., the "writeA" operation during single port mode), a first word-line WLA associated with a first memory cell 100 may be activated in order to perform a read operation from the first memory cell 100 based on decoded address signals AA, and, with the memory array 210 operating in the dual port mode, a second word-line WLB may be activated in order to perform a read operation from a second memory cell 100 based on decoded address signals AB. The decoded address signals AA and AB may correspond to different rows of the memory array 210. Later during the memory clock cycle, the PM signal 230 may be set low to place the memory array 210 in a single port mode. During the single port mode, the write assist operation may be performed on the first memory cell 100. In such an example, the same first word-line WLA may remain activated as the memory array 210 is toggled from the dual port mode to the single port mode. Later during the memory clock cycle and during the single port mode, a second word-line WLB may be activated based on the decoded address signals AA in order to perform the write assist operation for the first memory cell 100 (i.e., the "writeA" operation), as described above. As such, both the first word-line WLA and the second-world line WLB may be activated based on the decoded address signals AA in order to perform the write assist operation for the first memory cell 100. Further, the period of time between the initial activation of the first word-line WLA during the dual mode operation of the array 210 and the activation of the second word-line WLB during the single mode operation of the array 210 may be greater than or equal to the time delay needed for the charges to sufficiently decay on the complementary bit-line pairs associated with other memory cells 100 on the same row as the first memory cell 100. As such, the write assist operation performed on the first memory cell 100 using the first word-line WLA and the second word-line WLB memory cell 100 may avoid injecting a charge that would disturb a stored value in one or more of the other cells 100 of the same row.

In another example, prior to performing the write assist operation for the first memory cell 100 during the memory clock cycle (i.e., the "writeA" operation during single port mode), the first word-line WLA associated with a first memory cell 100 may be activated in order to perform a read operation from the first memory cell 100 based on decoded address signals AA, and, with the memory array 210 operating in the dual port mode, the second word-line WLB may be activated in order to perform a read operation from a second memory cell 100 based on decoded address signals AB. However, in this example, the decoded address signals AA and AB may correspond to the same row of the memory array 210. Accordingly, to avoid disturbing the stored values of other cells 100 on the same row, the second word-line WLB may be activated only after a first time delay has passed from when the first word-line WLA was activated, as was discussed above with respect to read assist mechanisms. Later during the memory clock cycle, the PM signal 230 may be set low to place the memory array 210 in a single port mode. During the single port mode, the write assist operation may be performed on the first memory cell 100. In such an example, the same first word-line WLA and the same second word-line WLB may remain activated as the memory array 210 is toggled from the dual port mode to the single port mode, as these word-lines already correspond to the row of the first memory cell 100. In particular, later during the memory clock cycle and during the single port mode, the first word-line WLA and the second word-line WLB may be used to perform the write assist operation for the first memory cell 100 based on the decoded address signals AA, as described above.

In yet another example, prior to performing the write assist operation for the first memory cell 100 during the memory clock cycle (i.e., the "writeA" operation), the first word-line WLA associated with a first memory cell 100 may be activated in order to perform a read operation from the first memory cell 100 based on decoded address signals AA. However, the memory array 210 may be operating in the single port mode, where the second word-line WLB may be not be activated. As such, only the first word-line WLA may be used to perform a read operation, as was discussed above with respect to read assist mechanisms. Later during the memory clock cycle, the PM signal 230 may be set such that the memory array 210 remains in the single port mode. In particular, later during the memory clock cycle and during the single port mode, the write assist operation may be performed on the first memory cell 100. In such an example, the same first word-line WLA may remain activated as the memory array 210 is toggled from the dual port mode to the single port mode. Later during the memory clock cycle and during the single port mode, a second word-line WLB may be activated based on the decoded address signals AA in order to perform the write assist operation for the first memory cell 100 (i.e., the "writeA" operation), as described above. As such, both the first word-line WLA and the second-world line WLB may be activated based on the decoded address signals AA in order to perform the write assist operation for the first memory cell 100. Further, the period of time between the initial activation of the first word-line WLA and the activation of the second word-line WLB may be greater than or equal to the time delay needed for the charges to sufficiently decay on the complementary bit-line pairs associated with other memory cells 100 on the same row as the first memory cell 100. As such, the write assist operation performed on the first memory cell 100 using the first word-line WLA and the second word-line WLB memory cell 100 may avoid injecting a charge that would disturb a stored value in one or more of the other cells 100 of the same row.

Other similar examples of toggling the memory array 210 between a single port mode and a dual port mode during a single memory clock cycle may be implemented as well, as known to those skilled in the art. It should be noted, however, that certain examples may not be performed by the memory device 200 discussed above with respect to FIGS. 2-5. In one such example, prior to performing the write assist operation for the first memory cell 100 during the memory clock cycle (i.e., the "writeA" operation), the first word-line WLA and the second word-line WLB may not both be used to perform write operations to the memory array 210, either to the same row or to different rows of the array 210.

In another implementation, the memory device 200 may be configured to perform a bypass operation for a memory array 210 operating in a dual port mode. In such an operation, the memory array 210 may be used to perform a write operation in single port mode to a particular cell 100 using data from a first port (e.g., port A), and used to perform a read operation in dual port mode from the same cell 100 for transfer from the device 200 using a second port (e.g., port B). In such an implementation, at the beginning of a single memory clock cycle, the PM signal 230 may be set low to place the memory array 210 in a single port mode. In addition, at the beginning of the memory clock cycle, a second word-line WLB associated with a first memory cell 100 may be activated in order to perform a write operation to the first memory cell 100 based on decoded address signals AA from port A, where the data to be written was received from the data input DA of port A. A first word-line WLA associated with the memory cell 100 may then be activated for a write assist operation based on decoded address signals AA, where the first word-line WLA is activated only after a time delay has passed from when the second word-line WLB was activated in order to also write the data input DA into the memory cell 100. Later during the memory clock cycle, the PM signal 230 may be set high to place the memory array 210 in a dual port mode. As such, later during the memory clock cycle and during the dual port mode, the second word-line WLB may remain active and be used to perform a read operation from the memory cell 100, where the data from the memory cell 100 is read out as data output QB of port B. During the read operation, the first word-line WLA may be used to perform a write operation. Other implementations of a bypass operation known to those skilled in the art may be used, as well.

Figure 7:
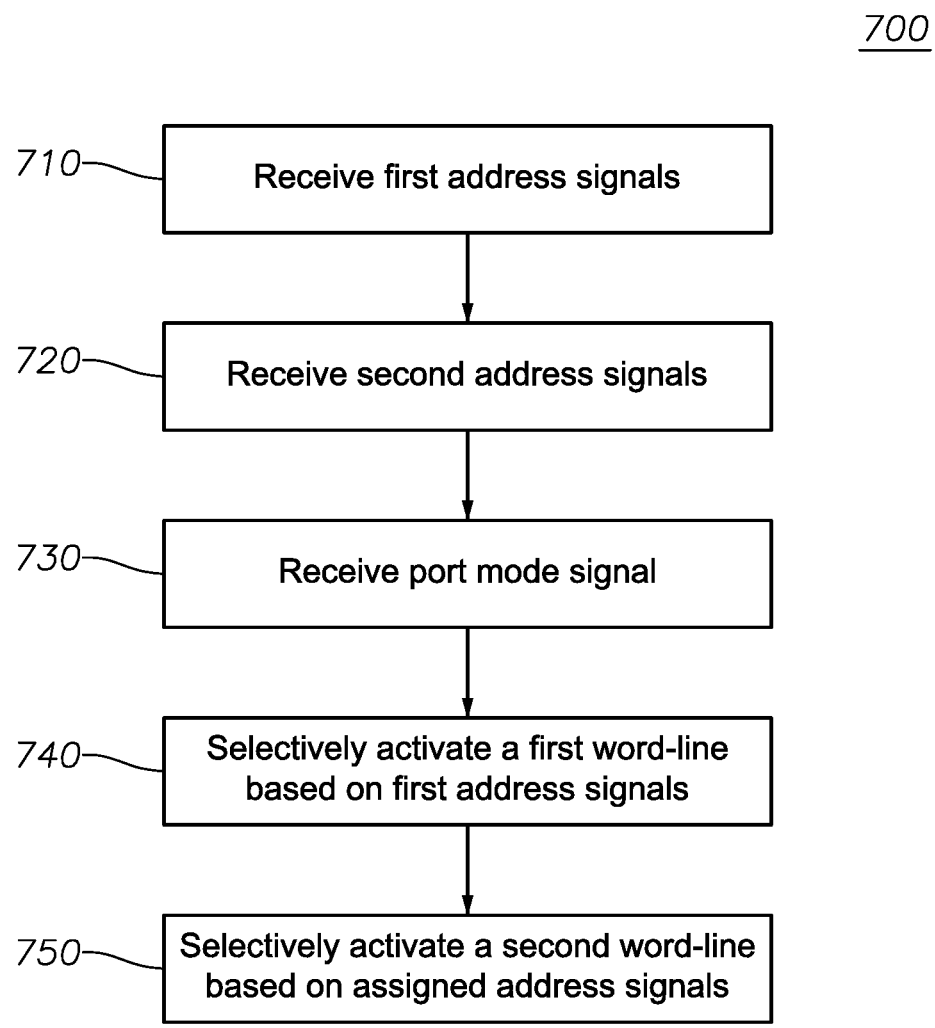
FIG. 7 illustrates a process flow diagram for a method of using a port mode signal in a memory device in accordance with various implementations described herein.

FIG. 7 illustrates a process flow diagram for a method 700 of using a PM signal in a memory device in accordance with various implementations described herein. It should be understood that while method 700 indicates a particular order of execution of operations, in some implementations, certain portions of the operations might be executed in a different order, and on different systems. Further, in some implementations, additional operations or blocks may be added to the method. Likewise, some operations or blocks may be omitted.

At block 710, a memory device may be configured to receive first address signals via a first port. For example, as shown in FIG. 2, the memory device 200 may be configured to receive address signals AA via a port A.

At block 720, the memory device may be configured to receive second address signals via a second port. For example, as shown in FIG. 2, the memory device 200 may be configured to receive address signals AB via a port B.

At block 730, the memory device may be configured to receive a PM signal. As shown in FIG. 2, the memory device 200 may be configured to receive the PM signal 230. In one implementation, the PM signal may be received by the memory device, such as via an input pin. In another implementation, the PM signal may be derived by the memory device based on other signals, such as an internal memory clock, memory enable signals, write enable signals, and/or any other signals known to those skilled in the art.

At block 740, the memory device may be configured to selectively activate one of a plurality of first word-lines of a memory array based on the first address signals. For example, as shown in FIG. 3, the access control circuitry 220 may include a first control circuitry 222, which may be used, in conjunction with the word-line drivers 235, to selectively activate one of the first word-lines WLA of the array 210 based on the address signals AA. Further, the first control circuitry 222 may be used by the input/output circuitry 240 to selectively activate one of the first pairs of complementary bit-lines BLA, NBLA of the array 210.

At block 750, the memory device may be configured to selectively activate one of a plurality of second word-lines of the memory array based on assigned address signals. For example, as shown in FIG. 3, the access control circuitry 220 may include a second control circuitry 224, which may be used, in conjunction with the word-line drivers 235, to selectively activate one of the second word-lines WLB of the array 210. In particular, the second control circuitry 224 may include address selection circuitry 530, which may be used to select the assigned address signals based on the PM signal 230. (See FIG. 5). Further, the second control circuitry 224 may be used to selectively activate one of the second pairs of complementary bit-lines BLB, NBLB of the array 210.

In sum, a memory device can use a PM signal to toggle a memory array between a single port mode and a dual port mode. As such, a memory device operating in a low voltage environment may include a memory array that can operate in both dual port mode and single port mode, such as by inputting a value for the PM signal using an input pin of the memory device. In particular, dual port operations, such as read-read operations or read-write operations, may be performed during a period of delay that can benefit the performance of a write assist operation.

The description provided herein may be directed to specific implementations. It should be understood that the discussion provided herein is provided for the purpose of enabling a person with ordinary skill in the art to make and use any subject matter defined herein by the subject matter of the claims.

It should be intended that the subject matter of the claims not be limited to the implementations and illustrations provided herein, but include modified forms of those implementations including portions of implementations and combinations of elements of different implementations in accordance with the claims. It should be appreciated that in the development of any such implementation, as in any engineering or design project, numerous implementation-specific decisions should be made to achieve a developer's specific goals, such as compliance with system-related and business related constraints, which may vary from one implementation to another. Moreover, it should be appreciated that such a development effort may be complex and time consuming, but would nevertheless be a routine undertaking of design, fabrication, and manufacture for those of ordinary skill having benefit of this disclosure.

Reference has been made in detail to various implementations, examples of which are illustrated in the accompanying drawings and figures. In the detailed description, numerous specific details are set forth to provide a thorough understanding of the disclosure provided herein. However, the disclosure provided herein may be practiced without these specific details. In some other instances, well-known methods, procedures, components, circuits and networks have not been described in detail so as not to unnecessarily obscure details of the embodiments.

It should also be understood that, although the terms first, second, etc. may be used herein to describe various elements, these elements should not be limited by these terms. These terms are only used to distinguish one element from another. For example, a first element could be termed a second element, and, similarly, a second element could be termed a first element. The first element and the second element are both elements, respectively, but they are not to be considered the same element.

The terminology used in the description of the disclosure provided herein is for the purpose of describing particular implementations and is not intended to limit the disclosure provided herein. As used in the description of the disclosure provided herein and appended claims, the singular forms "a," "an," and "the" are intended to include the plural forms as well, unless the context clearly indicates otherwise. The term "and/or" as used herein refers to and encompasses any and all possible combinations of one or more of the associated listed items. The terms "includes," "including," "comprises," and/or "comprising," when used in this specification, specify a presence of stated features, integers, steps, operations, elements, and/or components, but do not preclude the presence or addition of one or more other features, integers, steps, operations, elements, components and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context. The terms "up" and "down"; "upper" and "lower"; "upwardly" and "downwardly"; "below" and "above"; and other similar terms indicating relative positions above or below a given point or element may be used in connection with some implementations of various technologies described herein.

While the foregoing is directed to implementations of various techniques described herein, other and further implementations may be devised in accordance with the disclosure herein, which may be determined by the claims that follow. Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. A memory device, comprising:
  a memory array comprising a plurality of memory cells, wherein the memory cells are configured to be accessed using a plurality of first word-lines and a plurality of second word-lines;
  a plurality of access ports, comprising a first access port and a second access port, wherein the first access port is configured to receive first address signals and first clock signals, and wherein the second access port is configured to receive second address signals and second clock signals; and
  access control circuitry used to selectively activate one of the plurality of first word-lines based on the first address signals and the first clock signals, and used to selectively activate one of the plurality of second word-lines based on assigned address signals and assigned clock signals, wherein the access control circuitry comprises:
    address selection circuitry configured to select the assigned address signals based on a port mode signal, wherein the address selection circuitry selects the first address signals as the assigned address signals when the port mode signal indicates a single port mode, and wherein the address selection circuitry selects the second address signals as the assigned address signals when the port mode signal indicates a dual port mode; and
    clock selection circuitry used to select the assigned clock signals based on the port mode signal, wherein the clock selection circuitry selects the first clock signals as the assigned clock signals when the port mode signal indicates the single port mode, and wherein the clock selection circuitry selects the second clock signals as the assigned clock signals when the port mode signal indicates the dual port mode.

2. The memory device of claim 1, wherein the address selection circuitry comprises a 2-to-1 multiplexer, wherein the address selection circuitry selects the first address signals as the assigned address signals when the port mode signal is a logic 0 value, and wherein the address selection circuitry selects the second address signals as the assigned address signals when the port mode signal is a logic 1 value.

3. The memory device of claim 1, wherein the access control circuitry further comprises:
  a first row decoder used to selectively activate the one of the plurality of first word-lines based on the first address signals; and
  a second row decoder used to selectively activate the one of the plurality of second word-lines based on the assigned address signals received from the address selection circuitry.

4. The memory device of claim 1, wherein the port mode signal is received via an input pin of the memory device.

5. The memory device of claim 1, wherein the access control circuitry is configured to selectively activate one of the plurality of first word-lines and to selectively activate one of the plurality of second word-lines in conjunction with one or more word-line drivers.

6. The memory device of claim 1, wherein the selectively activated one of the plurality of first word-lines and the selectively activated one of the plurality of second word-lines are used to write the same data value to a single memory cell when the memory array is operating in the single port mode, and wherein the one of the plurality of second word-lines is selectively activated after a period of delay from when the one of the plurality of first word-lines is selectively activated when the memory array is operating in the single port mode.

7. The memory device of claim 1, wherein the memory array is configured to toggle between the single port mode and the dual port mode one or more times in a memory clock cycle based on the port mode signal.

8. A memory device, comprising:
a memory array comprising a plurality of memory cells, wherein the memory cells are configured to be accessed using a plurality of first word-lines and a plurality of second word-lines;
a plurality of access ports, comprising a first access port and a second access port, wherein the first access port is configured to receive first address signals and the second access port is configured to receive second address signals; and
access control circuitry used to selectively activate one of the plurality of first word-lines based on the first address signals, and used to selectively activate one of the plurality of second word-lines based on assigned address signals, wherein the access control circuitry comprises:
  address selection circuitry configured to select the assigned address signals based on a port mode signal, wherein the address selection circuitry selects the first address signals as the assigned address signals when the port mode signal indicates a single port mode, and wherein the address selection circuitry selects the second address signals as the assigned address signals when the port mode signal indicates a dual port mode; and
wherein:
  the memory array is configured to toggle between the single port mode and the dual port mode one or more times in a memory clock cycle based on the port mode signal;
  the memory array is configured to operate in the dual port mode at the beginning of the memory clock cycle, wherein the access control circuitry:
    selectively activates the one of the plurality of first word-lines in order to perform a write operation to a first memory cell; and
    selectively activates the one of the plurality of second word-lines in order to perform a read operation from a second memory cell, wherein the first memory cell and the second memory cell are positioned in different rows of the memory array; and
  the memory array is configured to operate in the single port mode during the memory clock cycle after a period of delay from when the one of the plurality of first word-lines is selectively activated, wherein the access control circuitry selectively activates the one of the plurality of second word-lines in order to perform a write operation to the first memory cell.

9. A memory device, comprising:
a memory array comprising a plurality of memory cells, wherein the memory cells are configured to be accessed using a plurality of first word-lines and a plurality of second word-lines;
a plurality of access ports, comprising a first access port and a second access port, wherein the first access port is configured to receive first address signals and the second access port is configured to receive second address signals; and
access control circuitry used to selectively activate one of the plurality of first word-lines based on the first address signals, and used to selectively activate one of the plurality of second word-lines based on assigned address signals, wherein the access control circuitry comprises:
  address selection circuitry configured to select the assigned address signals based on a port mode signal, wherein the address selection circuitry selects the first address signals as the assigned address signals when the port mode signal indicates a single port mode, and wherein the address selection circuitry selects the second address signals as the assigned address signals when the port mode signal indicates a dual port mode; and
wherein:
  the memory array is configured to toggle between the single port mode and the dual port mode one or more times in a memory clock cycle based on the port mode signal;
  the memory array is configured to operate in the dual port mode at the beginning of the memory clock cycle, wherein the access control circuitry:
    selectively activates the one of the plurality of first word-lines in order to perform a read operation from a first memory cell; and
    selectively activates the one of the plurality of second word-lines in order to perform a read operation from a second memory cell after a first period of delay from when the one of the plurality of first word-lines is selectively activated, wherein the first memory cell and the second memory cell are positioned in a same row of the memory array; and
  the memory array is configured to operate in the single port mode during the memory clock cycle and after the read operations, wherein the access control circuitry selectively activates the one of the plurality of second word-lines in order to perform a write operation to the first memory cell.

10. A memory device, comprising:
a memory array comprising a plurality of memory cells, wherein the memory cells are configured to be accessed using a plurality of first word-lines and a plurality of second word-lines;
a plurality of access ports, comprising a first access port and a second access port, wherein the first access port is configured to receive first address signals and the second access port is configured to receive second address signals; and
access control circuitry used to selectively activate one of the plurality of first word-lines based on the first address signals, and used to selectively activate one of the plurality of second word-lines based on assigned address signals, wherein the access control circuitry comprises:
  address selection circuitry configured to select the assigned address signals based on a port mode signal, wherein the address selection circuitry selects the first address signals as the assigned address signals when the port mode signal indicates a single port mode, and wherein the address selection circuitry selects the second address signals as the assigned address signals when the port mode signal indicates a dual port mode; and wherein:
the memory array is configured to toggle between the single port mode and the dual port mode one or more times in a memory clock cycle based on the port mode signal;
the memory array is configured to operate in the single port mode at the beginning of the memory clock cycle, wherein the access control circuitry initially activates the one of the plurality of first word-lines in order to perform a read operation from a first memory cell, and wherein the one of the plurality of second word-lines are inactive; and
the memory array is configured to continue to operate in the single port mode during the memory clock cycle and after the read operation, wherein the access control circuitry selectively activates the one of the plurality of second word-lines in order to perform a write operation to the first memory cell.

11. A memory device, comprising
a memory array comprising a plurality of memory cells, wherein the memory cells are configured to be accessed using a plurality of first word-lines and a plurality of second word-lines;
a plurality of access ports, comprising a first access port and a second access port, wherein the first access port is configured to receive first address signals and the second access port is configured to receive second address signals; and
access control circuitry used to selectively activate one of the plurality of first word-lines based on the first address signals, and used to selectively activate one of the plurality of second word-lines based on assigned address signals, wherein the access control circuitry comprises:
address selection circuitry configured to select the assigned address signals based on a port mode signal, wherein the address selection circuitry selects the first address signals as the assigned address signals when the port mode signal indicates a single port mode, and wherein the address selection circuitry selects the second address signals as the assigned address signals when the port mode signal indicates a dual port mode; and
wherein:
the memory array is configured to toggle between the single port mode and the dual port mode one or more times in a memory clock cycle based on the port mode signal; and
the memory device is configured to perform a bypass operation, wherein:
the first access port is configured to receive a first data;
the memory array is configured to operate in the single port mode at the beginning of a memory clock cycle, wherein the access control circuitry:
selectively activates the one of the plurality of second word-lines in order to perform a write operation of the first data to a memory cell; and
selectively activates the one of the plurality of first word-lines in order to perform a write operation of the first data to the memory cell after a period of delay from when the one of the plurality of second word-lines is selectively activated;
the memory array is configured to operate in the dual port mode during the memory clock cycle, wherein the access control circuitry selectively activates the one of the plurality of second word-lines in order to perform a read operation of the first data from the first memory cell; and
the second access port is configured to output the first data in response to the read operation.

12. A method, comprising:
receiving first address signals and first clock signals via a first access port of a memory device;
receiving second address signals and second clock signals via a second access port of the memory device;
receiving a port mode signal at the memory device, wherein the port mode signal indicates whether a memory array of the memory device is to operate in a single port mode or a dual port mode;
selectively activating one of a plurality of first word-lines of the memory array based on the first address signals and the first clock signals; and
selectively activating one of a plurality of second word-lines of the memory array based on assigned address signals and assigned clock signals, wherein selectively activating the one of the plurality of second word-lines comprises:
selecting the first address signals as the assigned address signals and the first clock signals as the assigned clock signals when the port mode signal indicates the memory array is to operate in the single port mode; and
selecting the second address signals as the assigned address signals and the second clock signals as the assigned clock signals when the port mode signal indicates the memory array is to operate in the dual port mode.

13. The method of claim 12, further comprising writing the same data value to a single memory cell of the memory array when the memory array is operating in the single port mode.

14. The method of claim 12, wherein selectively activating the one of the plurality of second word-lines further comprises selectively activating the one of the plurality of second word-lines after a period of delay from when the one of the plurality of first word-lines is selectively activated when the memory array is operating in the single port mode.

15. The method of claim 12, further comprising toggling the memory array between the single port mode and the dual port mode one or more times in a memory clock cycle based on the port mode signal.

16. A method, comprising:
receiving first address signals via a first access port of a memory device;
receiving second address signals via a second access port of the memory device;
receiving a port mode signal at the memory device, wherein the port mode signal indicates whether a memory array of the memory device is to operate in a single port mode or a dual port mode;
selectively activating one of a plurality of first word-lines of the memory array based on the first address signals; and
selectively activating one of a plurality of second word-lines of the memory array based on assigned address signals, wherein selectively activating the one of the plurality of second word-lines comprises:
selecting the first address signals as the assigned address signals when the port mode signal indicates the memory array is to operate in the single port mode; and selecting the second address signals as the assigned address signals when the port mode signal indicates the memory array is to operate in the dual port mode;

toggling the memory array between the single port mode and the dual port mode one or more times in a memory clock cycle based on the port mode signal;

receiving the port mode signal at the beginning of the memory clock cycle, wherein the port mode signal indicates the memory array is to operate in the dual port mode;

selectively activating the one of the plurality of first word-lines in order to perform a write operation to a first memory cell;

selectively activating the one of the plurality of second word-lines in order to perform a read operation from a second memory cell, wherein the first memory cell and the second memory cell are positioned in different rows of the memory array;

receiving the port mode signal again during the memory clock cycle, wherein the port mode signal indicates the memory array is to operate in the single port mode; and after a period of delay from when the one of the plurality of first word-lines is selectively activated, selectively activating the one of the plurality of second word-lines in order to perform a write operation to the first memory cell.

17. An integrated circuit, comprising:

a static random-access memory (SRAM) array comprising a plurality of SRAM cells, wherein the SRAM cells are configured to be accessed using a plurality of first word-lines and a plurality of second word-lines;

a plurality of access ports, comprising a first access port and a second access port, wherein the first access port is configured to receive first address signals and first clock signals, and wherein the second access port is configured to receive second address signals and second clock signals; and access control circuitry used to selectively activate one of the plurality of first word-lines based on the first address signals and the first clock signals, and used to selectively activate one of the plurality of second word-lines based on assigned address signals and assigned clock signals, the access control circuitry comprising:

address selection circuitry configured to select the assigned address signals based on a port mode signal, wherein the address selection circuitry selects the first address signals as the assigned address signals when the port mode signal indicates a single port mode, and wherein the address selection circuitry selects the second address signals as the assigned address signals when the port mode signal indicates a dual port mode; and clock selection circuitry used to select the assigned clock signals based on the port mode signal, wherein the clock selection circuitry selects the first clock signals as the assigned clock signals when the port mode signal indicates the single port mode, and wherein the clock selection circuitry selects the second clock signals as the assigned clock signals when the port mode signal indicates the dual port mode.

18. The integrated circuit of claim 17, wherein the address selection circuitry comprises a 2-to-1 multiplexer, wherein the address selection circuitry selects the first address signals as the assigned address signals when the port mode signal is a logic 0 value, and wherein the address selection circuitry selects the second address signals as the assigned address signals when the port mode signal is a logic 1 value.

* * * * *